(12) United States Patent
Gschwind

(10) Patent No.: US 10,324,687 B2
(45) Date of Patent: *Jun. 18, 2019

(54) SINGLE OPERATION ARRAY INDEX COMPUTATION

(71) Applicant: INTERNATIONAL BUSINESS MACHINES CORPORATION, Armonk, NY (US)

(72) Inventor: Michael K. Gschwind, Chappaqua, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/807,642

(22) Filed: Nov. 9, 2017

(65) Prior Publication Data

US 2018/0067718 A1     Mar. 8, 2018

Related U.S. Application Data

(63) Continuation of application No. 14/820,770, filed on Aug. 7, 2015, now Pat. No. 9,875,082, which is a continuation of application No. 14/500,251, filed on Sep. 29, 2014, now Pat. No. 9,658,821.

(51) Int. Cl.
*G06F 5/01* (2006.01)
*G06F 9/30* (2018.01)
*G06F 9/35* (2018.01)
*G06F 9/355* (2018.01)
*G11C 19/00* (2006.01)

(52) U.S. Cl.
CPC ............ *G06F 5/01* (2013.01); *G06F 9/30134* (2013.01); *G06F 9/35* (2013.01); *G06F 9/355* (2013.01); *G11C 19/00* (2013.01)

(58) Field of Classification Search
None
See application file for complete search history.

(56) References Cited

U.S. PATENT DOCUMENTS

| 9,658,821 | B2 | 5/2017 | Gschwind | |
| 9,875,082 | B2* | 1/2018 | Gschwind | G06F 5/01 |
| 10,013,258 | B2* | 7/2018 | Gschwind | G06F 9/30007 |
| 2016/0092166 | A1 | 3/2016 | Gschwind | |
| 2016/0092228 | A1* | 3/2016 | Gschwind | G06F 5/01 |
| | | | | 711/110 |
| 2016/0092241 | A1 | 3/2016 | Gschwind | |
| 2018/0067718 | A1* | 3/2018 | Gschwind | G06F 5/01 |

* cited by examiner

*Primary Examiner* — David H Malzahn
(74) *Attorney, Agent, or Firm* — Cantor Colburn LLP; Steven Chiu

(57) ABSTRACT

Embodiments are directed to a processor for adjusting an index, wherein the index identifies a location of an element within an array. The processor includes a shift circuit configured to perform a single operation that adjusts a first parameter of the index to match a parameter of an array address. The single operation further adjusts a second parameter of the index to match a parameter of an array element.

13 Claims, 13 Drawing Sheets

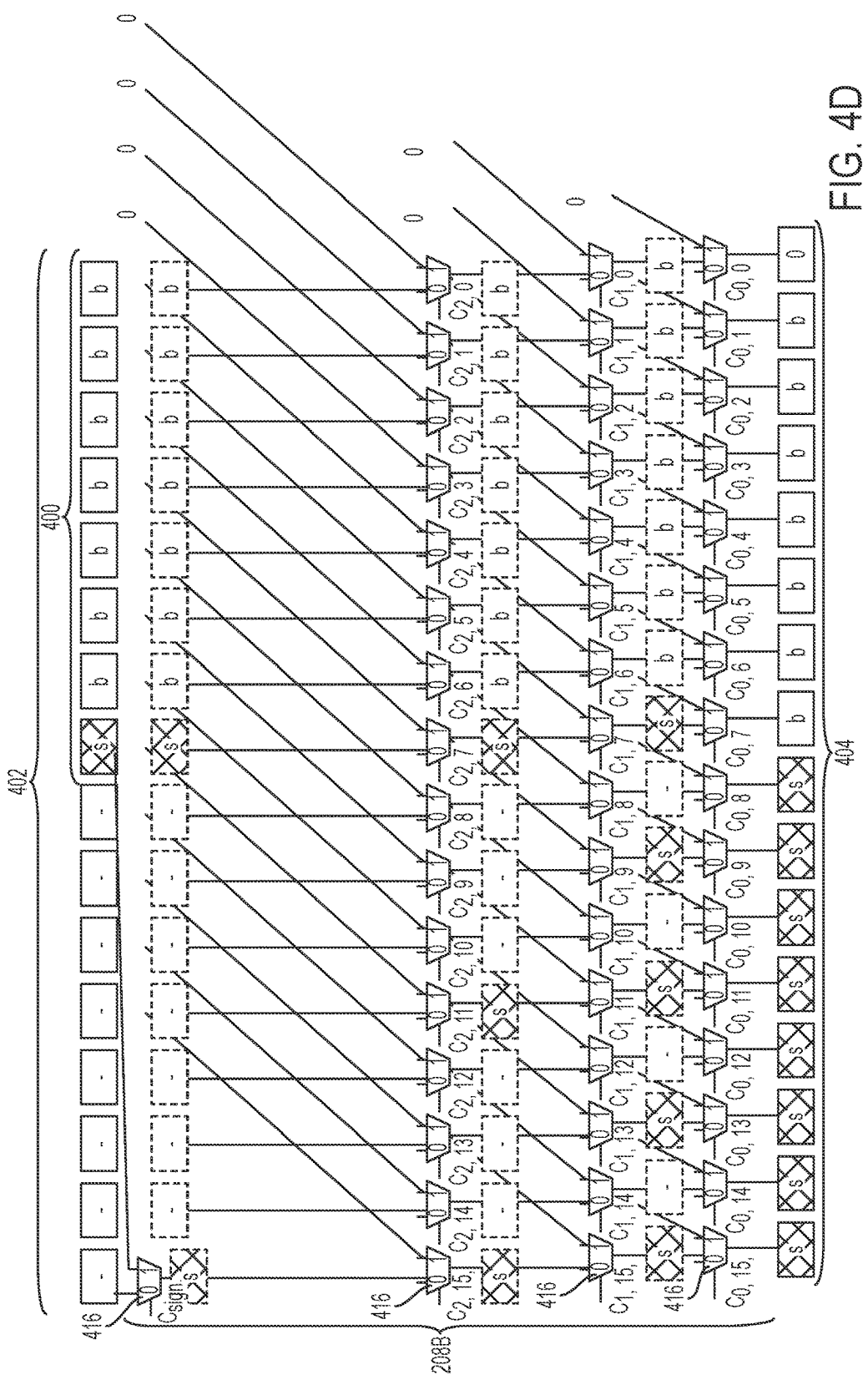

SINGLE OPERATION ARRAY INDEX COMPUTATION

DOMESTIC PRIORITY

This application is a continuation of U.S. application Ser. No. 14/820,770, filed Aug. 7, 2015, now issued as U.S. Pat. No. 9,875,082, which claims priority to U.S. application Ser. No. 14/500,251, filed Sep. 29, 2014, now issued as U.S. Pat. No. 9,658,821, the contents of which are incorporated by reference herein in its entirety.

BACKGROUND

The present disclosure relates in general to array index computations, and more specifically to reducing the overhead required to perform array index computations.

The simplest type of data structure in computer architecture is a linear array, which consists of a collection of elements (or values, or variables) each identified by at least one array index. A programmer locates and accesses a particular array element by knowing an address that identifies where the start of the particular array is located in memory, along with the index, which identifies how far from the array start address the element is actually located. An array is stored so that the position of each element can be computed from its index tuple by a mathematical formula. For example, an array of 10 32-bit integer variables, with indices 0 through 9, may be stored as 10 words at memory addresses 2000, 2004, 2008, . . . 2036, so that the element with index i has the address 2000+4×i. This operation is known generally as an array index computation.

For a variety of reasons, 64-bit servers must be able to execute 32-bit applications. This means that for a 32-bit application running on a 64-bit server, the array memory locations are 64-bits while the indices are 32-bits. The disparity between data types and address widths typically requires multiple step adjustments to a 32-bit application-generated index in order to perform an array index computation on a 64-bit server. Implementing the multiple adjustments to 32-bit indices typically requires multiple additional code instructions and corresponding processor circuitry, thereby increasing programming and processor overhead and potentially having a negative impact on system performance, particularly for large data sets.

SUMMARY

Embodiments are further directed to a processor for adjusting an index, wherein the index identifies a location of an element within an array. The processor includes a shift circuit configured to perform a single operation that adjusts a first parameter of the index to match a parameter of an array address. The single operation further adjusts a second parameter of the index to match a parameter of the element.

Embodiments are directed to a computer program product for adjusting an index, wherein the index identifies a location of an element within an array. The computer program includes a computer readable storage medium having program instructions embodied therewith, wherein the computer readable storage medium is not a transitory signal per se. The program instructions are readable by a processor circuit to cause the processor circuit to perform a method. The method includes the processor circuit configured to perform a single operation that adjusts a first parameter of the index to match a parameter of an array address. The single operation further adjusts a second parameter of the index to match a parameter of the element.

Embodiments are further directed to a method of adjusting an index, wherein the index identifies a location of an element within an array. The method includes performing, by a processor circuit, a single operation that adjusts a first parameter of the index to match a parameter of an array address. The single operation adjusts a second parameter of the index to match a parameter of the element.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIGS. 4A-4G depict diagrams illustrating examples of element sizes for which an index is computed in accordance with one or more embodiments.

Figure 1:
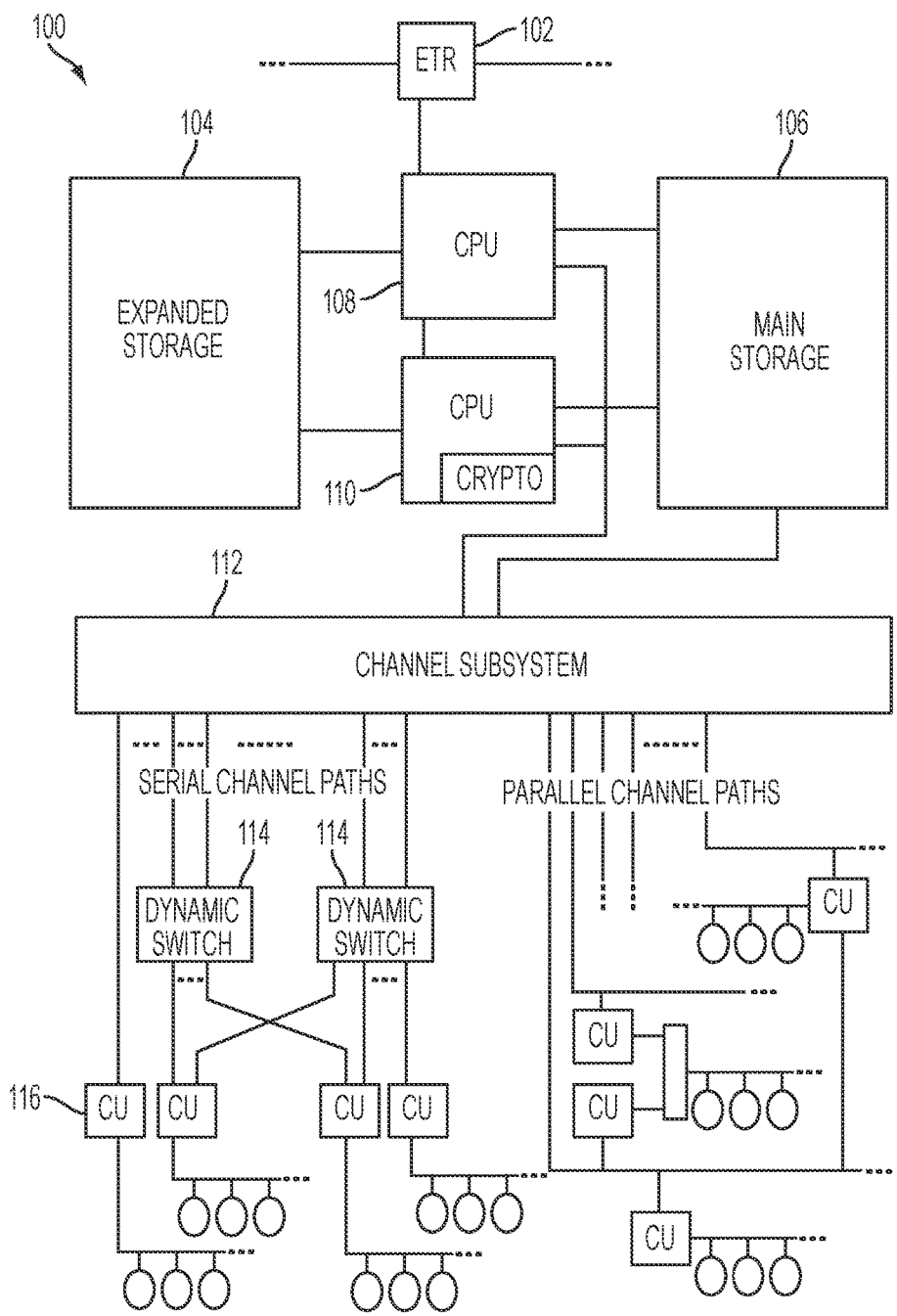
FIG. 1 depicts a logical structure of a z/Architecture system capable of implementing one or more embodiments of the present disclosure.

In the accompanying figures and following detailed description of the disclosed embodiments, the various elements illustrated in the figures are provided with three digit reference numbers. The leftmost digits of each reference number corresponds to the figure in which its element is first illustrated.

DETAILED DESCRIPTION

It is understood in advance that although this disclosure includes references to various computer programming methodologies (e.g., C, C++, C#, Java, etc.) and instruction set architectures (e.g., z/Architecture, Power ISA, etc.), implementation of the teachings recited herein are not limited to any particular computing environment. Rather, embodiments of the present disclosure are capable of being implemented in conjunction with any other type of computing environment now known or later developed.

The C programming language is a general purpose, procedural, imperative computer programming language developed in the early 1970s for the UNIX operating system. C is a complied language, which means that it must be run through a C compiler to turn the C program into an executable program that the computer can run. A C program, whatever its size, consists of functions and variables. A function contains statements that specify the computing operations to be done, and variables store values used during the computation. In the C programming language, a data type refers to an extensive system used for declaring variables or functions of different types. A variable's data type determines how much space it occupies in storage and how the bit pattern stored is interpreted. Integer data types in the C programming language include char, unsigned char, signed char, int, unsigned int, short, unsigned short, long and unsigned long.

The simplest type of data structure in computer architecture is a linear array, which consists of a collection of elements (or values, or variables) each identified by at least one array index. The array index is usually provided by a variable of integer data type (e.g., the data type "int" in C and C++ programming languages), which is assigned integer quantities. A programmer locates and accesses a particular array element by knowing an address that identifies where the start of the element's array is located in memory, along with an integer (i.e., index) that identifies how far from the array start address the element is actually located. An array is stored so that the position of each array element can be computed from its index tuple by a mathematical formula. For example, an array of 10 32-bit integer variables, with indices 0 through 9, may be stored as 10 words at memory addresses 2000, 2004, 2008, . . . 2036, so that the element with index i has the address 2000+4×i. This operation is known generally as an array index computation.

Computer system manufacturers continually strive for faster, more powerful processors in order to supply systems for demanding applications. Processors, in turn, have evolved from simple 8-bit microprocessors all the way to current 64-bit processors. The addressable memory of these processors has likewise grown exponentially. 32-bit processors could access $2^{32}$ bytes of virtual memory (4 gigabytes). Meanwhile, 64-bit processors can access $2^{64}$ bytes of virtual memory.

While increasing processor power and addressable memory space is advantageous, a large number of programs have already been written to operate in 32-bit environments. Accordingly, 64-bit processors are more than sufficient to run 32-bit programs. Additionally, in a 64-bit architecture, a 32-bit address only uses the low 32 bits of the possible 64 bits. Therefore, the high order bits, including the bits determining the memory region, will be equal to zero (0). As a result, 32-bit programs operating in a 64-bit processor generally conserve memory space.

With specific reference to array indexing in 64-bit servers, the index integer is typically still 32-bits even though the array address size is typically 64-bits. Thus, many applications have an assumption built in that the array address size is 64-bits and the array index integer variable is 32-bits. The disparity between data types and address widths typically requires multiple adjustments to a 32-bit application-generated index in order to perform an array index computation on a 64-bit server. In other words, the array index computation that computes the address of the element that the programmer is actually interested in must combine a 32-bit value with a 64-bit value. This requires two adjustments to the 32-bit value.

First, the 32-bit value must be "sign extended" to 64-bits so that it can be combined with the 64-bit address. Sign extension is the operation, in computer arithmetic, that increases the number of bits of a binary number while preserving the number's sign (positive/negative) and value. This is typically done by appending digits to the most significant side of the number, following a procedure dependent on the particular signed number representation used. For example, if six bits are used to represent the number "001010" (decimal positive 10) and the sign extend operation increases the word length to 16 bits, the new representation is simply "0000 000000001010". Thus, both the value and the fact that the value was positive are maintained.

Second, the index also must be adjusted for the size of the data to be accessed in order for the computer to understand the actual distance in bytes that the index specifies. For example, if each data item is 1-byte long, then element 10 is 10-bytes away from the start address where element 0 is located. If each data item is 8-bytes long, then element 10 is 80-bytes away from the start address. In other words, knowing that a desired location is 3 blocks away from a start location X does not provide the level of precision one would need to know exactly how far to walk. One would need to know the exact length of each block to know exactly how far to walk. If each block is 500 feet long, the desired location is actually 1500 feet (i.e., 3 blocks×500 feet) from start location X.

In contemporary programs and/or compilers, the above-described two adjustments require that multiple instructions are performed. The following instruction sequence includes known examples of the two instructions required to perform an array index computation in the C/C++ programming language. The sign extend instruction adjusts the 32-bit integer to become a 64-bit value, and the shift instruction adjusts the index in accordance with the element size.

ahi % r2, 1
larl % r1, a
lgfr % r2, % r2 (a sign extension)
ld % f0, 0(% r2, % r1) (a load instruction)

More specifically, for the sign extend instruction, "lgfr" is the z/Architecture instruction for sign extending a 32-bit register into a 64-bit register. For the shift instruction, "sllg" is the z/Architecture instruction that shifts left, thereby shifting left by 3, i.e., the shifting left of a 64-bit register by 3 bits (or multiplying by 8). Implementing an array index computation using multiple instructions of the type shown above increases programming and processor overhead, which has a negative overall impact on system performance, particularly for large data sets.

Systems and methodologies for providing a single instruction that performs both adjustments needed in order to complete an array index computation are disclosed in a co-pending, commonly assigned U.S. patent application entitled "SINGLE INSTRUCTION ARRAY INDEX COMPUTATION, invented by Michael K. Gschwind, filed Sep. 29, 2014 and bearing application Ser. No. 14/500,171, the entire disclosure of which is incorporated herein by reference in its entirety. The single instruction disclosed in the above-referenced, co-pending patent application accesses a 32-bit integer that is an index, sign extends the index to 64-bits, then adjusts the sign extended index in accordance with the size of the base element, which is provided as an offset that is used to access an array. Although disclosed in connection with 32-bit indices and 64-bit processor memory locations, the teachings of the co-pending, commonly assigned application apply to any differential between a parameter of the index and a parameter of the array memory. Implementing an array index computation using the single instruction of the co-pending, commonly assigned patent application decreases programming overhead, which has a positive overall impact on application performance, particularly for large data sets. Thus, the functioning of a computer itself may be improved.

The present disclosure provides systems and methodologies that support the implementation of a single instruction index array computation. More specifically, the present disclosure provides a circuit configuration for performing two adjustments at substantially the same time. In one or more disclosed embodiments, the two adjustments include a sign extension (performed as a "pseudo" shift) and a shift. In one or more disclosed embodiments, the circuit configuration includes a barrel shift circuit and selection logic thereof.

In its conventional operation, a barrel shifter includes two parts. One part is the data path, which directs where each bit in the source register (e.g., a 32-bit source) is "shifted" to in the target register (e.g., a 64-bit target). A second part is the selection logic, which instructs the data path as to which value in the source register to pick. Most of the work done by the barrel shifter is performed in the barrel shifter's data path. Hence, virtually all of the overhead (i.e., time, cost, etc.) contributed to the computer system by the barrel shifter comes from the barrel shifter's data path, and not from the barrel shifter's control/selection logic. However, under conventional operation, the selection logic and data path of a contemporary barrel shifter work together to perform one operation, which is to shift a specified value.

Under the present disclosure, the selection logic, which as noted above is the low-overhead portion of the barrel shifter, is configured to also perform a sign extension. Hence the barrel shifter of the present disclosure performs two adjustments (i.e., a sign extension and a shift) in the same operation/circuit. The present disclosure recognizes that a sign extension is a type of pseudo shift (i.e., shifting the sign bit to all positions to the left of the original sign bit location) operation that may be performed with appropriate instruction from control/selection logic, along with a regular shift by a MUX data path of a barrel shifter. For the sign extension adjustment, the sign bit in the source register is picked. For the shift adjustment, the data bit(s) of the source register are picked. Thus, the selection logic can control the data path to perform all of the pseudo shifts and the shifts (i.e., pseudo shifts that perform the sign extension, along with shifts that perform the data shift) associated with both adjustments in a single barrel shift operation. Overall operation of the computer is improved because the selection logic is a significantly smaller portion of the overall barrel shifter's overhead, contributing very little to the time and cost to the barrel shifter's operation.

Thus, in one or more embodiments the present disclosure provides systems and methodologies that perform a multiple step array index computation in a single operation. The single operation makes an adjustment corresponding to the size of a first data type specifying the position of a second data type within an array/aggregate to a third data type preferably corresponding to the size of an address. The single operation further makes an adjustment corresponding to the size of the second data type. In one or more embodiments, data adjustment is performed in a data path adapted to, for each data bit, perform the selection of a data bit from among a plurality of positions. The selection is performed to select based on one of either no adjustment, an adjustment corresponding to the size of the first data type specifying the position of a second data type within an array/aggregate, an adjustment corresponding to the size of the second data type, or an initialization.

Turning now to FIG. 1, there is shown a logical structure of a z/Architecture computer system 100 capable of incorporating one or more embodiments of the present disclosure. As shown, system 100 includes an external time reference (ETR) 102, an expanded storage 104, a main storage 106, a first central processing unit (CPU) 108, a second CPU 110, a channel subsystem 112, dynamic switches 114 and control units (CUs) 116 (for ease of illustration only one reference number for the CUs is shown), configured and arranged as shown. Specifically, expanded storage 104 and main storage 106 include array structures that are located and accessed according to an array index computation. Additional details of the overall operation of computer system 100 and a z/Architecture in general are disclosed in the following publications: *z/Architecture Principles of Operation*, Seventh Edition (February, 2008); and *z/Architecture Principles of Operation*, Tenth Edition (September 2012). Additional details of a Power ISA™ implementation of system 100 are disclosed in *Power ISA Version* 2.07 (May 10, 2013). Additional Power ISA documents are available via the World Wide Web at www.power.org. The entire disclosure of each of the above-referenced publications is incorporated by reference herein in its entirety.

CPUs 108, 110 can be, for example, a CISC-type (Complex Instruction Set Computer) CPU, RISC-type CPU (Reduced Instruction Set Computer), or a digital signal processor (DSP). Expanded storage 104 and main storage 106 (which can be memory such as random access memory (RAM), flash memory, or disk storage) stores one or more software applications (e.g., embedded applications) that, when executed by either or both CPUs 108, 110, perform any suitable function associated with the computer system 100.

CPUs 108, 110 typically are arranged to control and/or implement arithmetic functions used during the execution software applications (not shown). Such functions are often executed by an arithmetic logic unit (ALU) (not shown) of CPUs 108, 110, which is often used to perform various types of shift operations encountered in various arithmetic operations, including for example the sign extension and shift operations of the present disclosure. Portions of ALU of CPUs 108, 110 can be distributed among other components of computer system 100 and need not be physically located within a portion of computer system 100 reserved exclusively for the ALU.

Figure 2:
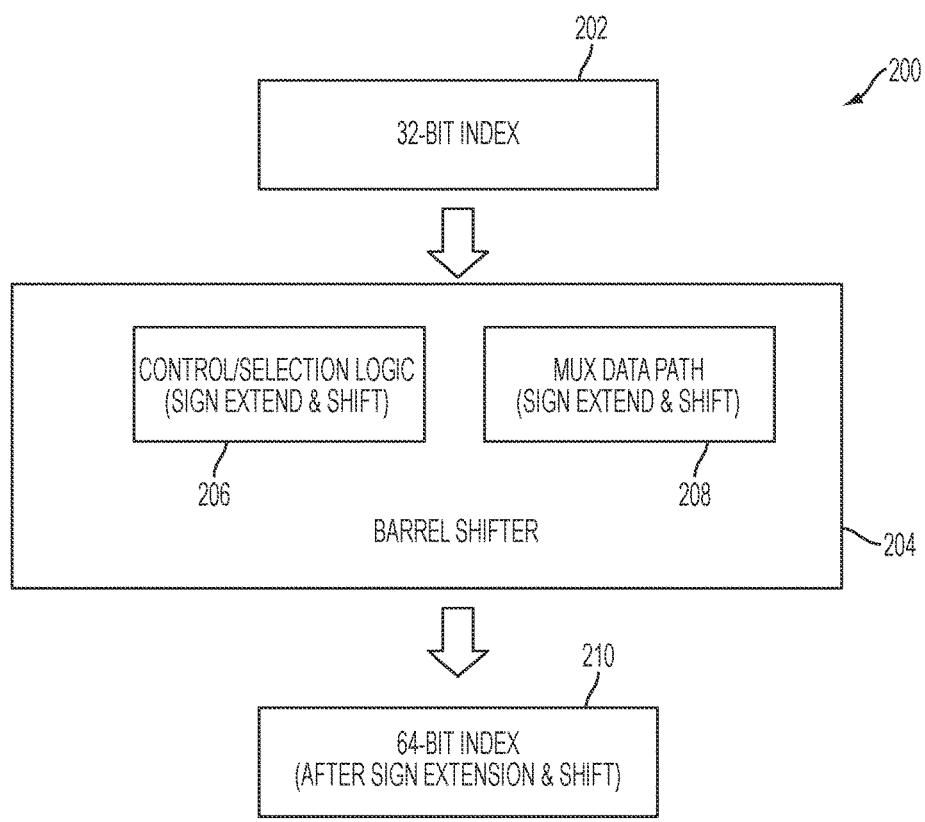
FIG. 2 depicts block diagram of a processor circuit configuration for performing in a single operation two adjustments in accordance with one or more embodiments.

Turning now to FIG. 2, there is depicted a block diagram showing a processor circuit configuration 200 for performing two adjustments at substantially the same time. As described above, circuit configuration 200 may be implemented as part of the ALU of CPUs 108, 110 shown in FIG. 1. As shown, processor circuit configuration 200 includes a 32-bit index 202, a barrel shifter 204, control/selection logic 206, a multiplexer (MUX) data path 208 and a 64-bit index 210 (after sign extension and shift), configured and arranged as shown. As a part of barrel shifter 204, control/selection logic 206 directs the selection of bits in MUX data path 208 to simultaneously perform sign extension and shift, and MUX data path 208 performs the actual data movements of 32-bit index 202 corresponding to a sign extend and shift to 64-bit index 210. In computer science, a logical shift is a bitwise operation that shifts all the bits of its operand. The two base variants are the logical left shift and the logical right shift. This is further modulated by the number of bit positions a given value shall be shifted, for example "shift left by 1" or a "shift right by n". Unlike an arithmetic shift, a logical shift does not preserve a number's sign bit or distinguish a number's exponent from its mantissa. Every bit in the operand is simply moved a given number of bit positions, and the vacant bit-positions are filled in, usually with zeros. A logical shift is often used when its operand is being treated as a sequence of bits rather than as a number. Logical shifts can be useful as efficient ways of performing multiplication or division of unsigned integers by powers of two. Shifting left by n bits on a signed or unsigned binary number has the effect of multiplying it by $2^n$. Shifting right by n bits on an unsigned binary number has the effect of dividing it by $2^n$. Because arithmetic right shift differs from logical right shift, many languages have different operators for them. For example, in C, C++ the right shift operator is ">>" and the left shift operator is "<<". Thus, a logical shift left by 1 could be represented as follows: (11001011<<1)= 10010110. A logical shift left by 3 could be represented as follows: (11001011<<3)=01011000.

Figure 3A:
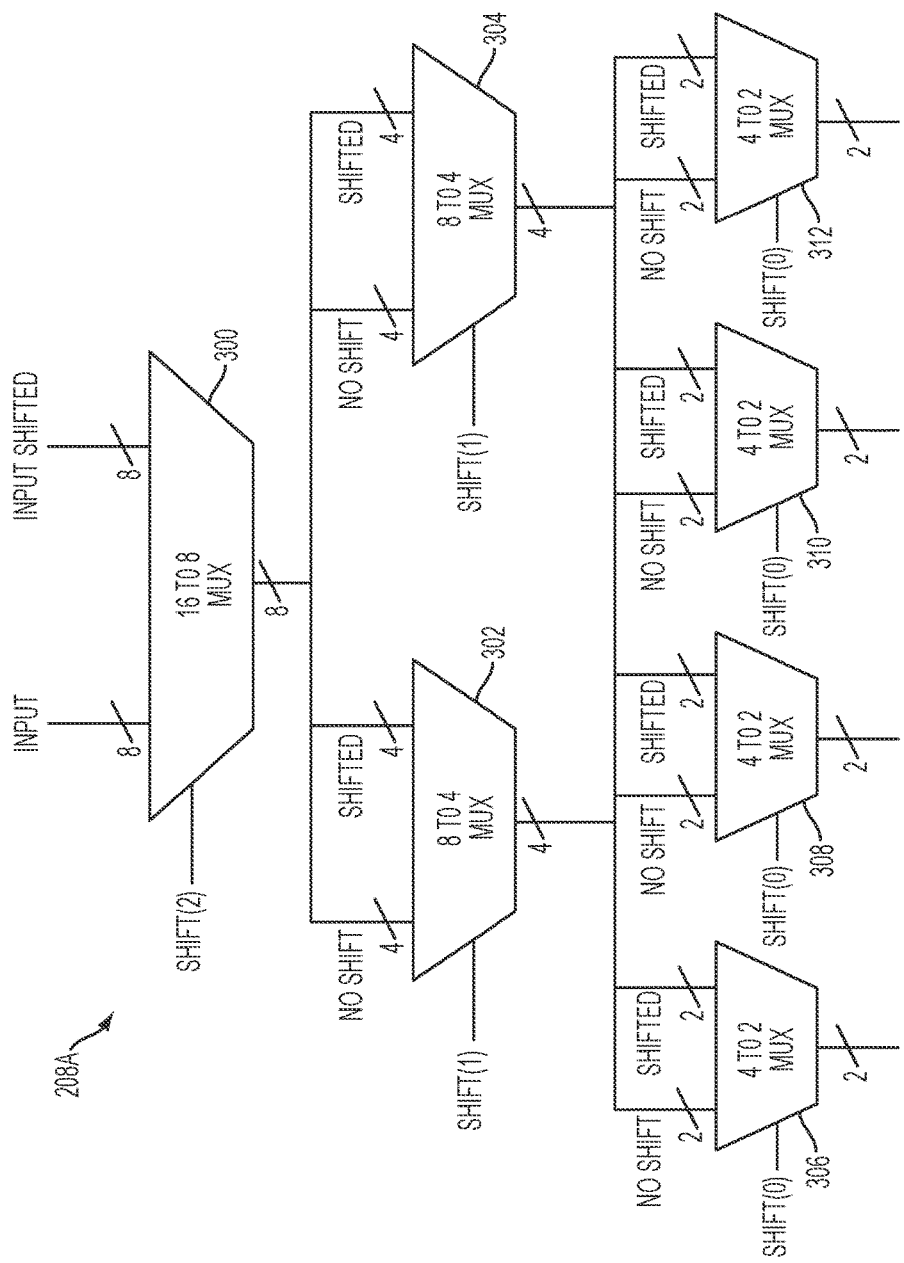
FIG. 3A depicts an example of data path of a barrel shifter in accordance with one or more embodiments.

FIG. 3A is a diagram illustrating a MUX data path 208A that is an example implementation of MUX data path 208 of barrel shifter 210 shown in FIG. 2. In some cases, an operation only requires a simple shift register that shifts the input by 1 bit every clock cycle. However, many operations require the ability to shift or rotate data an arbitrary number of bits. To shift data an arbitrary number of bits, a barrel shifter is used. In general, a barrel shifter is a digital circuit that can shift a data word by a specified number of bits in one clock cycle. It can be implemented as a sequence of MUXs, wherein the output of one MUX is connected to the input of the next MUX in a way that depends on the shift distance.

Exemplary MUX data path 208A shown in FIG. 3A is an 8-bit example that includes a hierarchy of MUXs 300, 302, 304, 306, 308, 310, 312, configured and arranged as shown. In operation, each MUX selects one of several input signals and forwards the selected input into a single line. A MUX of $2^n$ inputs has n select lines (e.g., SHIFT(2) of MUX 300), which are used to select which input line to send to the MUX output. MUXs increase the amount of data that can be sent over a network within a certain amount of time and bandwidth. A MUX performs like a multiple-input, single-output switch, wherein the switch is selectively controlled to connect one of the multiple inputs to the single output.

For an 8-bit rotate component, the MUXs shown in FIG. 3A are configured to perform as follows: the top level MUX 300 shift the data by 4 bits; the second level MUXs 302; 304 shift the data by 2 bits; and the third level MUXs 306, 308, 310, 312 shift the data by 1 bit. Using MUX data path 208A, input data can be shifted an arbitrary number of bits. The number of MUXs used for an 8-bit shift component is as follows: top level MUX 300 includes one 16-to-8 multiplexers; second level MUXs 302, 304 include two 8-to-4 multiplexers; and third level MUXs 306, 308, 310, 312 include four 4-to-2 multiplexers.

Data path 208A is arranged to receive a first operand for specifying the amount of a shift (shift count) and a second operand that is to be shifted by the shift count. In operation, control/selection logic 206 (shown in FIG. 2) provides control signals (e.g., SHIFT(2)) to each level of MUXs (e.g., first-level MUXs 300, second-level MUXs 302, 304, third-level MUXs 306, 308, 310, 312), wherein the control signals are generated in accordance with an amount and direction to shift the data. Each MUX 300, 302, 304, 306, 308, 310, 312 selectively shifts the input data using the control signals. For example, first-level MUX 300 is arranged to selectively shift the data by 1 bit position under the control of control/selection logic 206. The second-level MUXs 302, 304 are arranged to selectively shift the selected input data by two bit-positions under the control of control/selection logic 206. The third-level MUXs are arranged to selectively shift the data by four bit-positions under the control of control/selection logic 206.

Figure 3B:
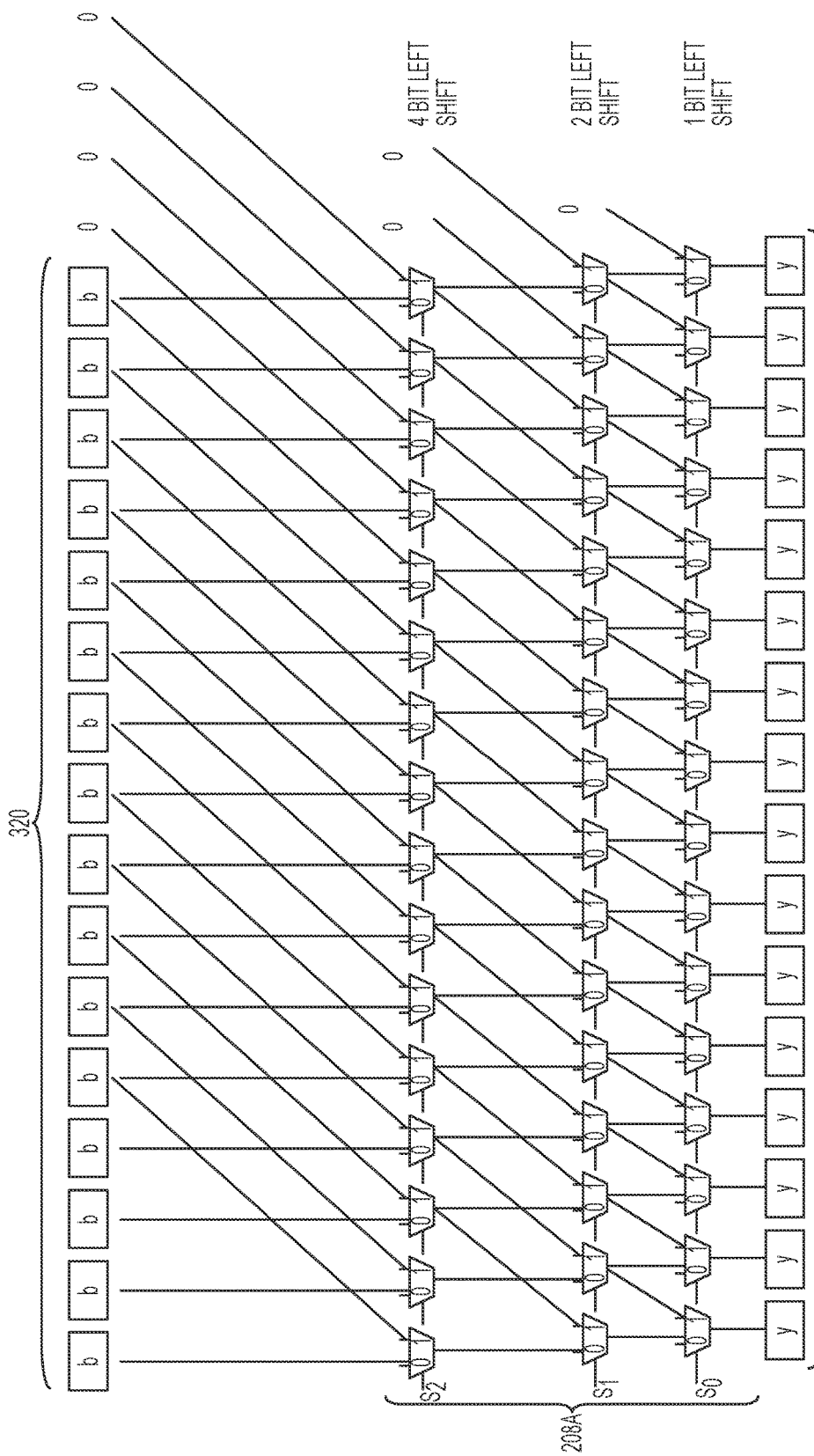
FIG. 3B depicts a diagram illustrating an example of wiring configuration for the barrel shifter shown in FIG. 3A.

FIG. 3B is a diagram that illustrates the wiring of a three-level shift tree that performs the shifting operations performed by data path 208A (shown in FIGS. 3A and 3B). FIG. 3B shows a 16-bit source register 320, a 16-bit target/shifted register 322 MUX data path 208A (broken into its subcomponents of multiple 2 to 1 MUXs) and control signals $S_2$, $S_1$, $S_0$. The "b" symbols shown in source register 320 represents any integer bit value, which can be zero (0) or one (1). The "y" symbols shown in target/shifted register 322 are placeholders for the shifted value that would result from the shift tree operation. As described above, for an 8-bit rotate component, the 2 to 1 MUXs shown in FIG. 3B are configured to perform as follows: $S_2$ controls the top level MUXs to shift the data by 4 bits; $S_1$ controls the second level MUXs to shift the data by 2 bits; $S_0$ controls the third level of MUXs to shift the data by 1 bit. Thus, using the shift tree wiring shown in FIG. 3B for MUX data path 208A, input data can be shifted an arbitrary number of bits.

FIGS. 4A-4G depict diagrams illustrating examples of element sizes for which an index is computed when performing two adjustments in a single operation in accordance with one or more embodiments. In the examples shown, for ease of illustration the adjustments are applied to an 8-bit index mapped into a 16-bit memory address. The teachings of the present disclosure are applicable to any disparity between an index and a memory address, as long as the index and memory address are not equal.

Figure 4A:
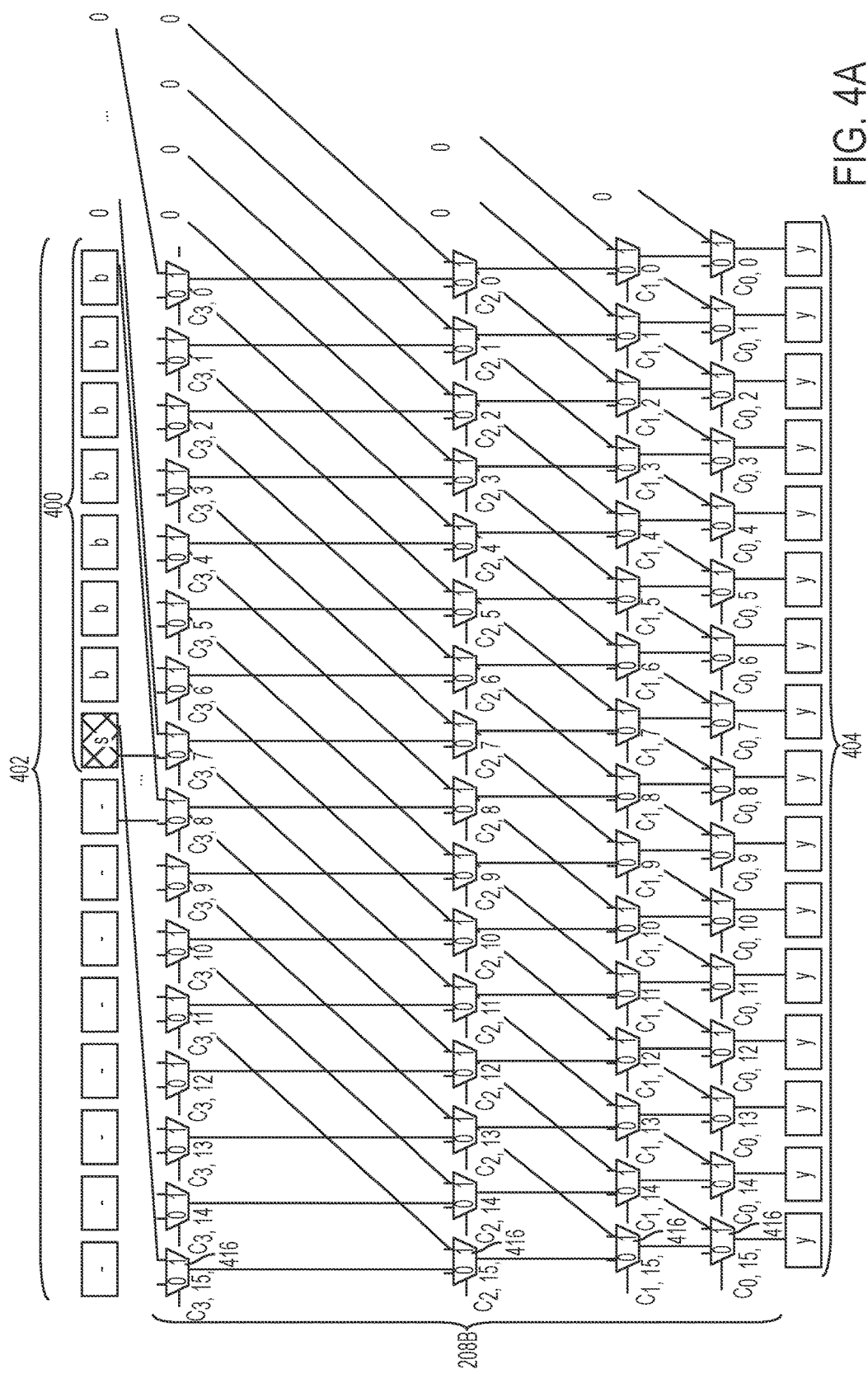
Figure 4B:
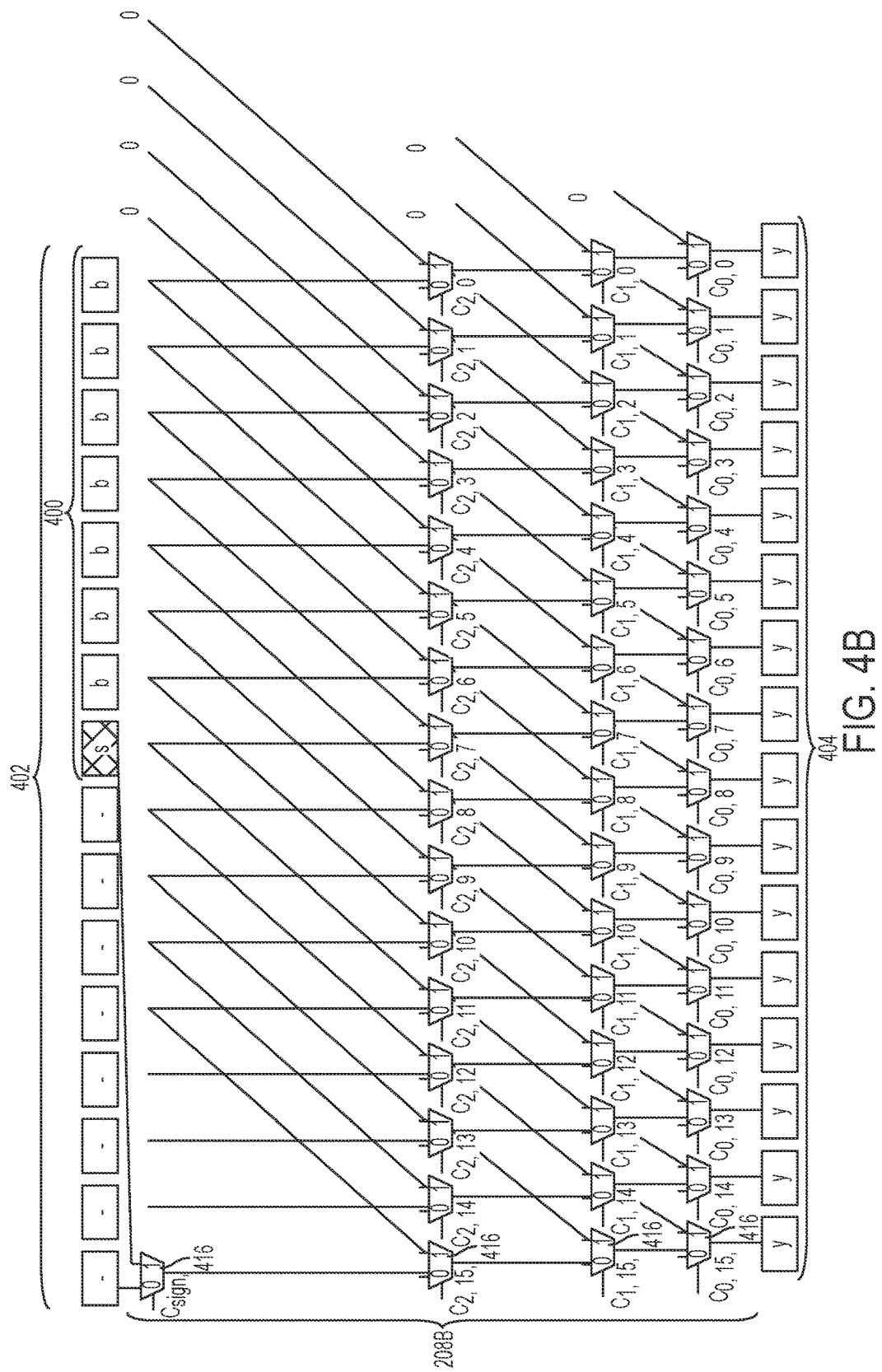

As shown in FIGS. 4A-4G, an 8-bit index 400 is loaded in a 16-bit source register 402. Within 16-bit source register 402, the following notations are used. A dash "-" represents a "don't care" bit state. "S" represents a sign bit. A "b" represents an integer bit value, which can be zero (0) or one (1). Thus, in the array index computation, the s-bit will need to be replicated (i.e., shifted) into the register positions occupied by dashes "-", and the remaining bits ("b"), which are the index, will need to be adjusted from the size of the integer value of the index (represented by the bits "b") to the size of the address (i.e., 16-bits). A 16-bit target register 404 contains the result index bit states after performing a sign extension and adjustment for the element data size used by the array for which an index is being computed in FIGS. 4A-4G. FIGS. 4A and 4B show examples of a shifter without example shift values to show the structure of the shift tree. Accordingly, the "y" symbols shown in target register 404 are placeholders for the shifted value that would result from the shift tree (e.g., MUX data path 208B) operation. Actual example values for target register 404 are shown in the examples shown in FIGS. 4C to 4G.

MUX data path circuit configuration 208B shown in FIGS. 4A-4G is another example of MUX data path 208 (shown in FIG. 2) and MUX data path 208A (shown in FIG. 3A). MUX data path 208B is a barrel shifter configuration that does the simultaneous extend/shift of the present disclosure under control of control/selection logic 206 (shown in FIG. 2) using various control signals (e.g., $C_{sign}$, $C_{2,15}$, $C_{1,15}$, $C_{0,15}$). For ease of illustration, MUX data path 208B is shown in an abbreviated, not fully populated format showing connections to a first level of multiplexing. In general, MUX data path 208B includes multiple MUXs 416, configured and arranged as shown. For ease of illustration, only selected multiplexers are marked with a reference number. Thus, MUX data path 208B is essentially a barrel shifter, which, as described and illustrated above, is a network that can shift by all possible values using a relatively small number of steps. This is done by decomposing a shift into a shift by a highest power of 2, then by the next lowest power of 2, etc. Thus, MUX data path 208B acts as a selection circuit, wherein for each position and in each level, a shift position is picked that is different from other shift positions by a power of 4. Thus, a first level of MUX path 208B (i.e., a MUX tree) is MUX 416 picking a value that is 8 bits to its right, or the value that is directly over it. In practice, however, there are two signals coming from a bit directly above the MUX, or from 8 positions to its right, and from a fixed shift-in value—typically 0—if no further bits are 8 positions to a MUX's right. However, for ease of illustration only the wiring for the first position (0), eighth position (7), ninth position (8) and sixteenth position (15) are shown. The next level is a by 4 shift. In the first two MUX levels shifts may be performed by 0, by 4, by 8, by 12 and combinations thereof to reach a desired number of shift positions.

In another embodiment, when the sign replication is to be performed across more bits than a barrel shifter is equipped to shift, additional initial sign replication stages are present. In one such exemplary embodiment, shown in FIG. 4B, a shift of up to 7 positions is supported. An additional sign replication MUX (substantially corresponding to shift logic for the position of the sign, as indicated by structural similarity of the wiring and control of the MUX controlled by $C_{sign}$ to that of the MUX controlled by control signal $C_{3,15}$) is provided and shown as controlled by control signal $C_{sign}$.

The data flow shown in FIGS. 4A-4G include multiple columns corresponding to each bit of the desired target data type representations, and multiple rows corresponding to each bit of a size specification for a data type to be accessed in memory (i.e., a shift value). In accordance with one or more embodiments, the rows are ordered with a row corresponding to a most significant bit weight of the second adjustment. In other words, a highest row weight adjustment is performed first. All four bit selections can be active in a single index computation flow in accordance with the following protocol. The sign bits that correspond to the replication of the sign bit in order to implement a sign extend operation are shown shaded in FIGS. 4A to 4G. Other bit values are shown superimposed on the corresponding signals as "b" for a bit of the original data value that is being adjusted, "0" as a 0 having been created by a shift left, and "-" to indicate a value that is of no consequence for the further operation. For example, the control signals $C_{i,j}$ corresponding to MUXs may be optimized to minimize control logic or wiring complexity and the optimization of such signals does not have to take into account a required output for a specific scenario. For example, signals $C_{2,14}$, $C_{2,13}$, $C_{2,12}$, $C_{2,10}$, $C_{2,9}$, $C_{2,8}$ may all be set to s(2) corresponding to a value also used for signals $C_{2,7}$ to $C_{2,0}$ sharing a signal wire, and also the logical signal that must be applied when the same barrel shifter is also used for a shift left operation in accordance with known art.

Figure 4C:
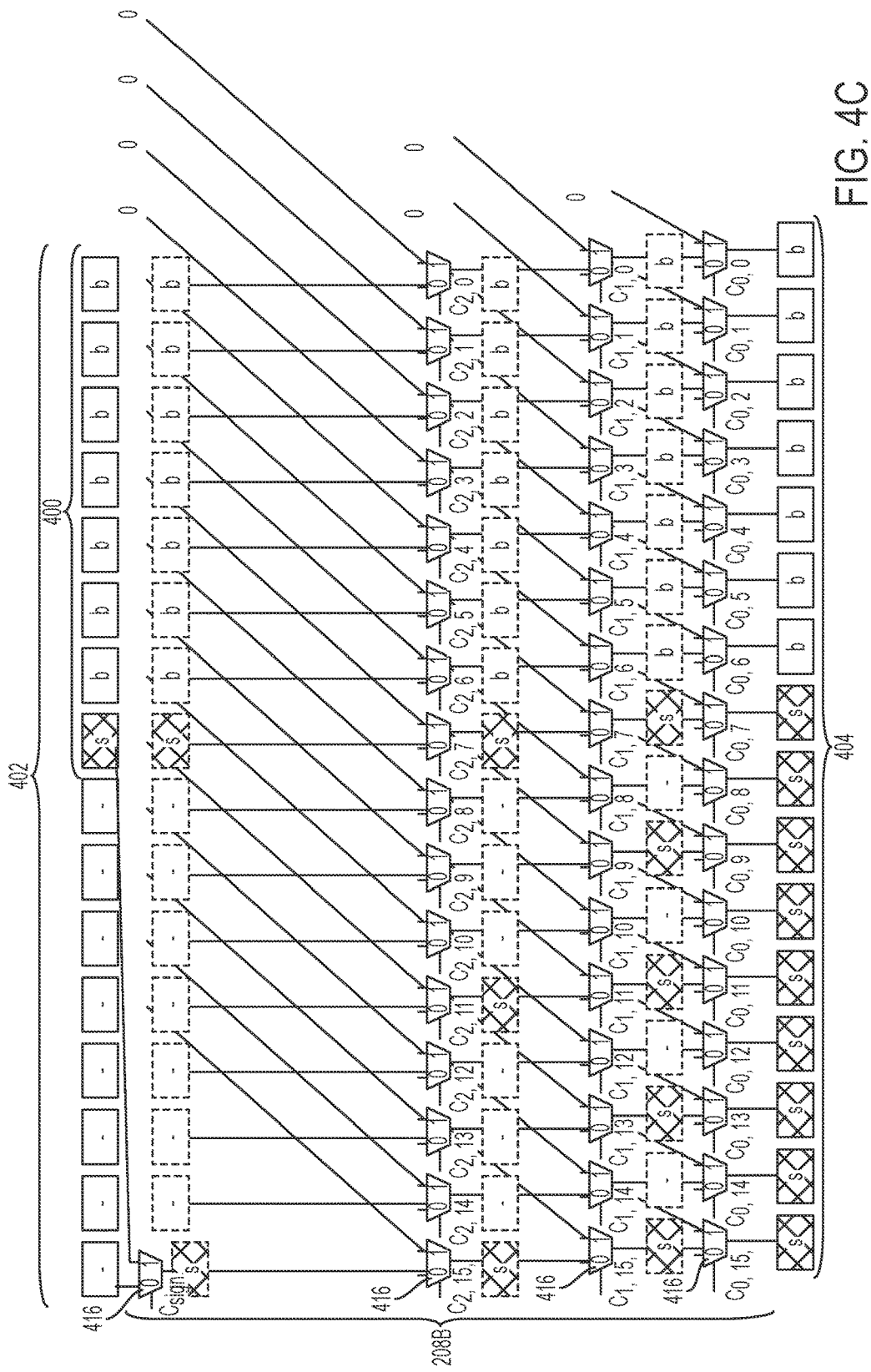

FIG. 4A shows a barrel shift modified in conjunction with the present disclosure to receive separate control signals for each MUX of MUX data path 208. Each row of MUXs is controlled by a single shift count in accordance with a conventional MUX network (i.e., a barrel shifter) that is adapted to perform the second adjustment (for the second data type size). MUXs of MUX data path 208 are controlled individually or in groups as follows:

(1) No adjustment is selected when a row does not correspond to a set bit in the second data type size indication, and when the bit corresponds to one of the original n bits of the input data type, as well to any of the processed adjustment positions for the second adjustment. For example, FIG. 4C shows examples of no adjustment being performed by the MUXs controlled by control bits $C_{2,7}$ to $C_{2,0}$, control bits $C_{1,7}$ to $C_{1,0}$ and control bits $C_{2,7}$ to $C_{2,0}$.

(2) An adjustment corresponding to the first adjustment is performed (i.e., replicating a sign bit, either directly or by replicating a previously generated replica of a sign bit in a previous stage) when a row does not correspond to a set bit in the second data type size indication, and the bit does not correspond to one of the original n bits of the input data type, as well to any of the processed adjustment positions for the second adjustment. For example, FIG. 4C shows examples of sign replication being performed by the MUXs controlled by control bit $C_{sign}$, control bits $C_{2,15}$, $C_{2,11}$, control bits $C_{1,15}$, $C_{1,13}$, $C_{1,11}$, $C_{1,9}$ and control bits $C_{1,15}$ to $C_{1,8}$. Of these adjustments, MUXs controlled by control bit $C_{sign}$, control bit $C_{2,11}$, control bits $C_{1,13}$, $C_{1,9}$ and control bits $C_{0,14}$, $C_{0,12}$, $C_{0,10}$, $C_{0,8}$ create a new replica in a new bit position. Of these adjustments, MUXs controlled by control bits $C_{2,15}$, control bits $C_{1,15}$, $C_{1,11}$ and control bits $C_{0,15}$, $C_{0,13}$, $C_{0,11}$, $C_{0,9}$ forward previously created replicas of the sign bit.

Figure 4E:
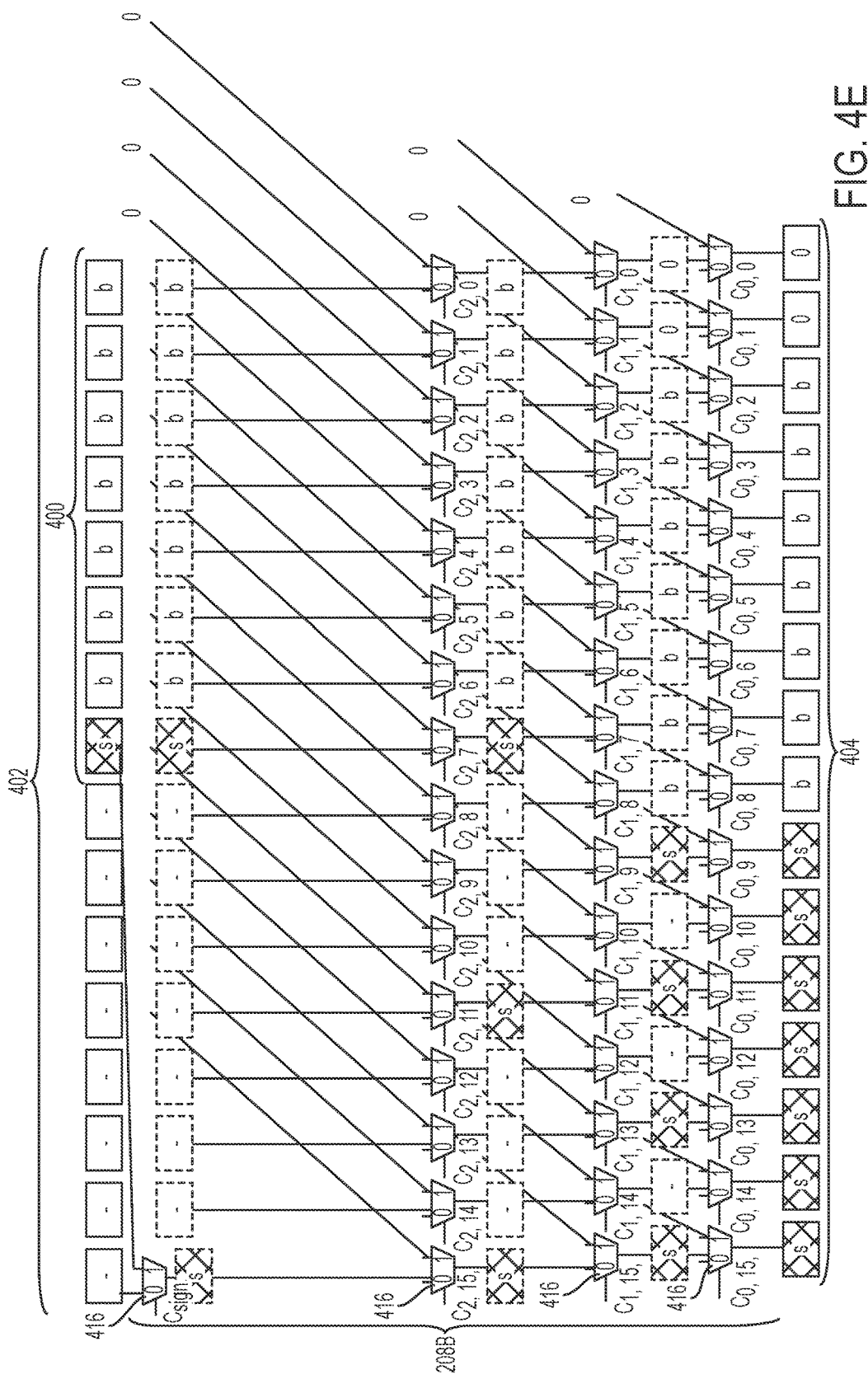
Figure 4F:
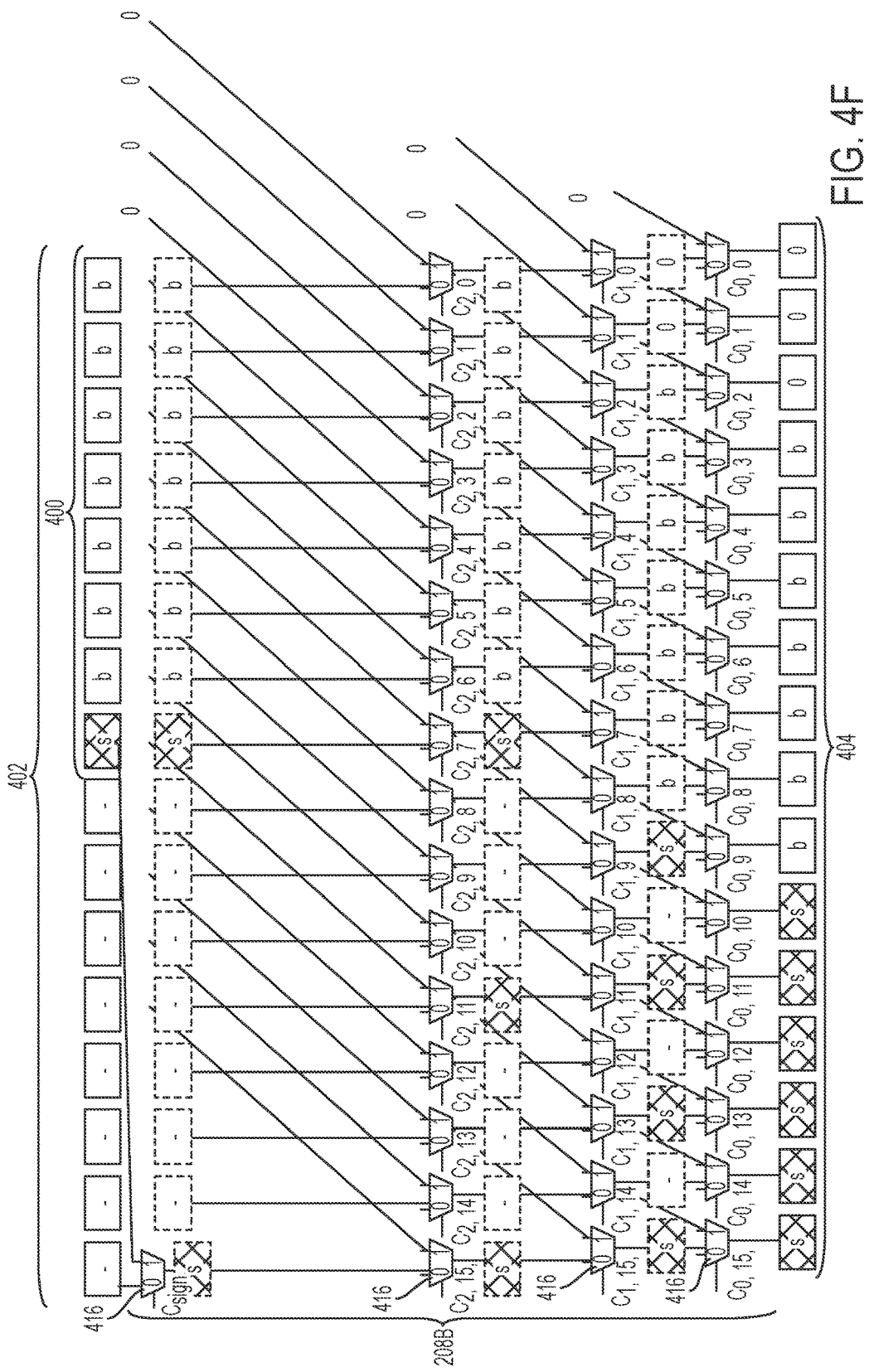
Figure 4G:
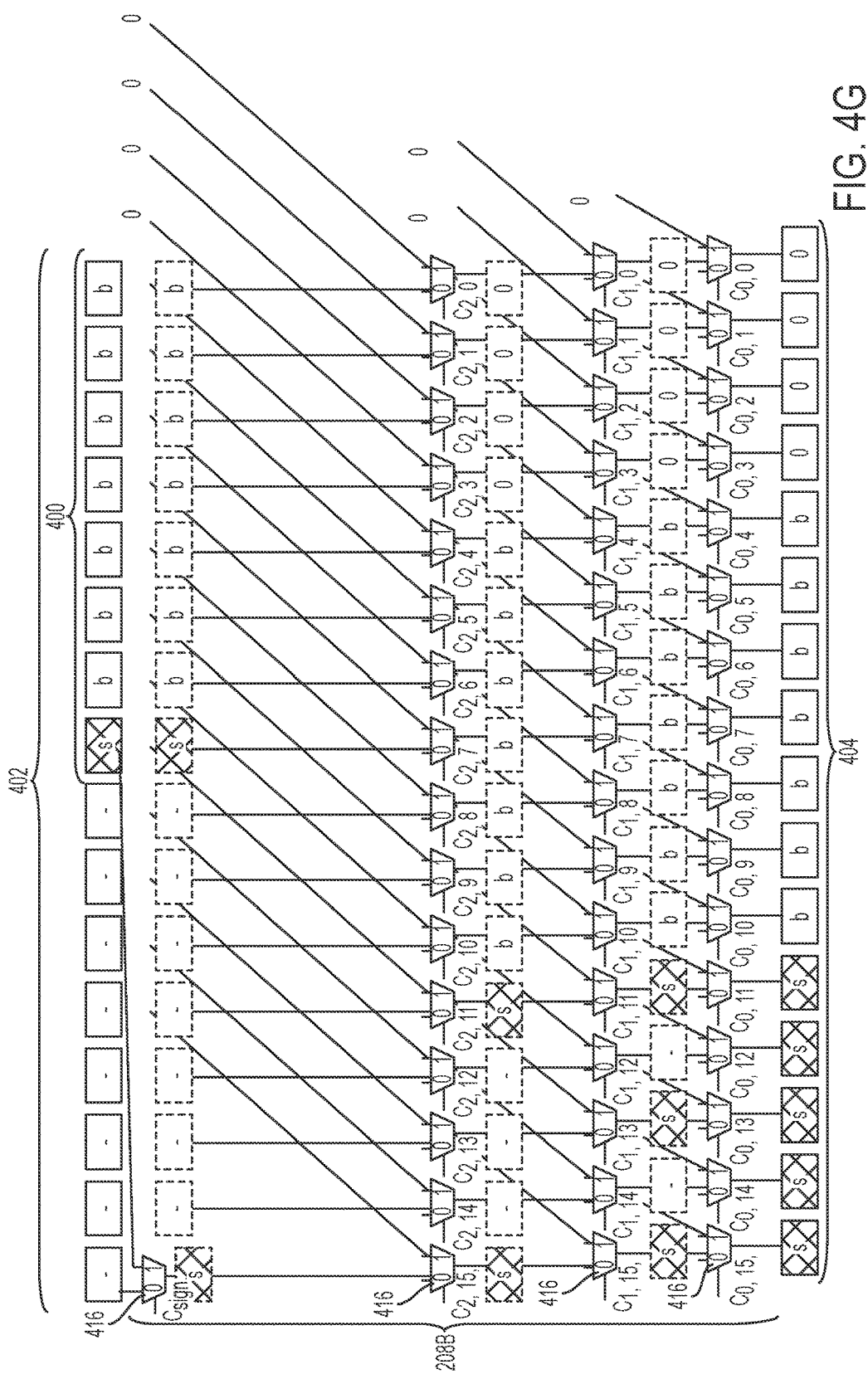

(3) An adjustment corresponding to the second adjustment is performed (e.g., by selecting a bit from a position which is 2^row weight bits to the right of a bit) when a row does correspond to a set bit in the second data type size indication, and the bit position corresponds to one of the original n bits of the input data type shifted by the previous multiplexor levels. The bit is initialized to zero (0) when a row does correspond to a set bit in the second data type size indication, and the bit position corresponds to an input position to the right of any provided input bits (i.e., a "shift in" is created and preferably initialized with 0). For example, FIG. 4D shows examples of a shift adjustment (i.e., a second adjustment corresponding to an element size) being performed by the MUXs controlled by control bits $C_{0,8}$ to $C_{0,0}$. The MUX controlled by control bit $C_{0,0}$ corresponding to a shift-in of 0. In another example, FIG. 4E shows examples of a shift adjustment (i.e., a second adjustment corresponding to an element size) being performed by the MUXs controlled by control bits $C_{1,9}$ to $C_{1,0}$. The MUXs controlled by control bits $C_{1,1}$ and $C_{1,0}$ corresponding to a shift-in of 0.

(4) An adjustment corresponding to the first adjustment is performed (e.g., by selecting a bit position from a position which is 2^row weight bits to the right of a bit) when a row does correspond to a set bit in the second data type size indication, and the bit does not correspond to one of the original n bits of the input data type, as well as to any of the processed adjustment positions for the second adjustment. For example, FIG. 4D shows examples of a shift adjustment (i.e., a second adjustment corresponding to an element size) being performed by the MUXs controlled by control bits $C_{0,15}$ to $C_{0,9}$. In another example, FIG. 4E shows examples of a shift adjustment (i.e., a second adjustment corresponding to an element size) being performed for bits not corresponding to the original input bits (i.e., to bits corresponding to sign bits being extended) by the MUX controlled by control bits $C_{1,15}$, $C_{1,13}$, $C_{1,11}$. The MUXs controlled by control bits $C_{1,15}$ and $C_{1,11}$ correspond to creating new sign replicas by passing a non-shifted sign value, and the MUX controlled by $C_{1,13}$ creates a shift adjustment to a previously created replica of a sign bit.

As noted herein, in accordance with the present disclosure, control/selection logic 206 shown in FIG. 2 controls MUX data path 208, 208A or 208B to incorporate both a sign extension (i.e., a pseudo shift of the sign bit into the "don't care" data fields to the left) and a shift within the normal shift operations performed by the MUX data path. In particular, control/selection logic 206 controls the MUX data path of the barrel shifter to perform its normal shift operation, which involves decomposing the shift into its component parts. For example, at the start it may be determined whether the value is greater than 8. If the value is greater than 8, it is shifted by 8 first. The next stage determines from what is remaining if the value is greater than 4. If the value is greater than 4, it is shifted by 4. This process continues to decrement until it reaches 1. For the sign extension operation, rather than shifting "don't care" data ("-"), control/selection logic 206 instructs the MUX data path to pick the locations where the sign bit (s) is known to be, and directs the MUX data path through a sequence of pseudo shift operations that in effect copy the sign bit to all locations to its left.

Thus, in an exemplary operation of FIG. 4C, in the first level, rather than picking the "don't care" data that is directly above, the MUX data path is instructed to pick the locations where the sign bit(s) is known to be, which is 8 locations to the right. Similarly, in the next level, instead of performing a by 4 shift, another copy of the sign bit is created that is 4 bits away from the original sign. Now, there are copies of the sign bit in an original location, as well as 8 bits and 4 bits to the left of the original location. In the next stage, which is a by 2 shift, control/selection logic 206 instructs MUX data path to replicate the bits again. This process continues until the sign bit has been copies into all positions to the left of the original location of the sign bit.

In accordance with embodiments of the present disclosure, the single operation adjustment logic selects a sign bit corresponding to the sign bit of the received input or a sign replica in each multiplexer when such a sign bit is present in one of the inputs of the multiplexor, when the multiplexor is not to receive a value of the original input in accordance with the shifting function. In accordance with at least one embodiment as shown in FIG. 4B, additional selection logic may be present to replicate a sign bit to additional positions not directly reachable with selection logic of a shifter, to inject or directly replicate such sign bit replica to perform a complete sign extension.

Control/selection logic 206 shown in FIG. 2 may be implemented in a variety of configurations. In accordance with embodiments of the present disclosure, control signals are generated such that a shift is performed for all positions receiving a shifted result value of an input value in accordance with the received input size shifted by the adjustment corresponding to the second data type. In accordance with embodiments of the present disclosure, control signals are generated to select a sign bit corresponding to the sign bit of the received input or a sign replica in each multiplexer when such a sign bit is present in one of the inputs of the multiplexor, when the multiplexor is not to receive a value of the original input in accordance with the shifting function. In accordance with at least one embodiment as shown in FIG. 4B, additional control signals for selection logic may be generated to replicate a sign bit to additional positions not directly reachable with selection logic of a shifter, in order to direct selection logic to inject or directly replicate such sign bit replica to perform a complete sign extension.

FIGS. 2-4G provide structural implementations representing the placement of MUXs and their interconnections. Control signals may be defined in a truth table, e.g., with a separate logic table for each value of $C_{i,j}$ for each adjustment size of the second adjustment. Thus, a logic table for $C_{i,j}$ for a shift value of 0 (i.e., only sign extension) and corresponding to FIG. 4C may be represented as follows:

| C | 15 | 14 | 13 | 12 | 11 | 10 | 9 | 8 | 7 | 6 | 5 | 4 | 3 | 2 | 1 | 0 |
|---|----|----|----|----|----|----|---|---|---|---|---|---|---|---|---|---|
| 3 | 1  |    |    |    |    |    |   |   |   |   |   |   |   |   |   |   |
| 2 | 0  | —  | —  | —  | 1  | —  | — | — | 0 | 0 | 0 | 0 | 0 | 0 | 0 | 0 |
| 1 | 0  | —  | 1  | —  | 0  | —  | 1 | — | 0 | 0 | 0 | 0 | 0 | 0 | 0 | 0 |
| 0 | 0  | 1  | 0  | 1  | 0  | 1  | 0 | 1 | 0 | 0 | 0 | 0 | 0 | 0 | 0 | 0 |

In accordance with one embodiment of FIG. 4B, wherein $C_{sign}=C_{3,15}$, no MUXs are present to be controlled by $C_{3,14}$ to $C_{3,0}$. In accordance with another embodiment of FIG. 4A, the MUXs shown therein are controlled by the $C_{3,14}$ to $C_{3,0}$ control signals set to 0 to indicate that no shift should take place. In accordance with another embodiment of FIG. 4A, control signals $C_{3,7}$ to $C_{3,0}$ are set to 0 to indicate that no shift should take place and control signals $C_{3,14}$ to $C_{3,8}$ are set to "-" (i.e., don't care).

Similarly, a logic table for $C_{i,j}$ for a shift value of 2 (i.e., sign extension and adjustment for an element size of 4 bytes) and corresponding to FIG. 4E may be represented as follows:

| C | 15 | 14 | 13 | 12 | 11 | 10 | 9 | 8 | 7 | 6 | 5 | 4 | 3 | 2 | 1 | 0 |
|---|----|----|----|----|----|----|---|---|---|---|---|---|---|---|---|---|
| 3 | 1  |    |    |    |    |    |   |   |   |   |   |   |   |   |   |   |
| 2 | 0  | —  | —  | —  | 1  | —  | — | — | 0 | 0 | 0 | 0 | 0 | 0 | 0 | 0 |
| 1 | 0  | —  | 1  | —  | 0  | —  | 1 | 1 | 1 | 1 | 1 | 1 | 1 | 1 | 1 | 1 |
| 0 | 0  | 1  | 0  | 1  | 0  | 1  | 0 | 0 | 0 | 0 | 0 | 0 | 0 | 0 | 0 | 0 |

In accordance with one embodiment of FIG. 4B, wherein $C_{sign}=C_{3,15}$, no multiplexors are present to be controlled by $C_{3,14}$ to $C_{3,0}$. In accordance with another embodiment of FIG. 4A, the MUXs shown therein are controlled by the $C_{3,14}$ to $C_{3,0}$ set to 0 to indicate that no shift should take place. In accordance with another embodiment of FIG. 4A, control signals $C_{3,7}$ to $C_{3,0}$ are set to 0 to indicate that no shift should take place and $C_{3,14}$ to $C_{3,8}$ are set to "-" (i.e., don't care).

The below-provided, register-transfer-level description notation describes one methodology for another implementation of control logic/selection logic 206 using a register-transfer-level description (e.g., one similar to the known VHDL register transfer level representation, and further providing ^ as exponentiation operator) for computing the control signals C(i,j) in accordance with the exemplary embodiment shown in FIGS. 4A-4G, or any other examples that fall within the scope of the present disclosure.

C(i,j)<=1 WHEN (i=3 AND j=7+2^3*k), ELSE
1 WHEN (i=2 AND j=7+2^2*k AND j=>7+effectiveshift (s,2)) ELSE
1 WHEN (i=1 AND j=7+2*k AND j=>7+effectiveshift(s, 1)) ELSE
1 WHEN (i=0 AND j=7+k AND j=>7+effectiveshift(s,0)) ELSE
1 WHEN (s(i) AND j<=7+effectiveshift(s,i)) ELSE
0;

In the above register-transfer-level notation, "k" is any positive, odd number, "s" represents the size of the second adjustment as a shift count, and "effectiveshift(a,b)" is a function that computes an adjusted shift count from a shift count a and excluding shifts to be performed by multiplexor logic with a weight lower than b, e.g., in one embodiment effectiveshift(a,b)<=a AND NOT (2^b−1).

More generally, the register-transfer-level equation shown above might be expressed as follows, wherein SIGNBIT indicates the position of the sign bit:
C(i,j)<=1 WHEN (j=7+2^i*k AND j>=SIGNBIT+effectiveshift(s,i)) ELSE
  1 WHEN (s(i) AND j<=7+effectiveshift(s,i)) ELSE
  0;

In accordance with one or more embodiments, additional logic may be included if the shift adjustment does not have enough stages to allow it to seed all most significant bit positions to receive a copy of the input sign bit which is to be replicated. In accordance with one or more embodiment, the barrel shifter 204 (shown in FIG. 2) is used to further perform at least one of shift and rotate instructions, wherein a first set of control signals computed in conjunction with performing dual adjustments are applied to MUX control signals Ci,j of MUX data path 208 in a first mode of operation corresponding to performing a dual adjustment operation, and at least a second set of control signals, e.g., corresponding to performing a logical shift, is performed in a second mode of operation performing one or more of a shift, a shift logical, a shift under mask, a rotate, and so forth.

In another embodiment, the disclosed single operation that performs the sign-extend and shift operations of an array index computation in one clock cycle may be implemented as a rotate and insert instruction. An example of a suitable rotate and insert instruction is in the z/Architecture as a "ROTATE THEN INSERT SELECTED BITS" instruction shown as the instruction RISBGN $R_1,R_2,I_3,I_4[,I_5]$. Another example of a suitable rotate and insert instruction is in the Power ISA as a "Rotate Left Word Immediate Then Mask" instruction shown as the instruction rlwimi RA,RS, SH,MB,ME.

Figure 5A:
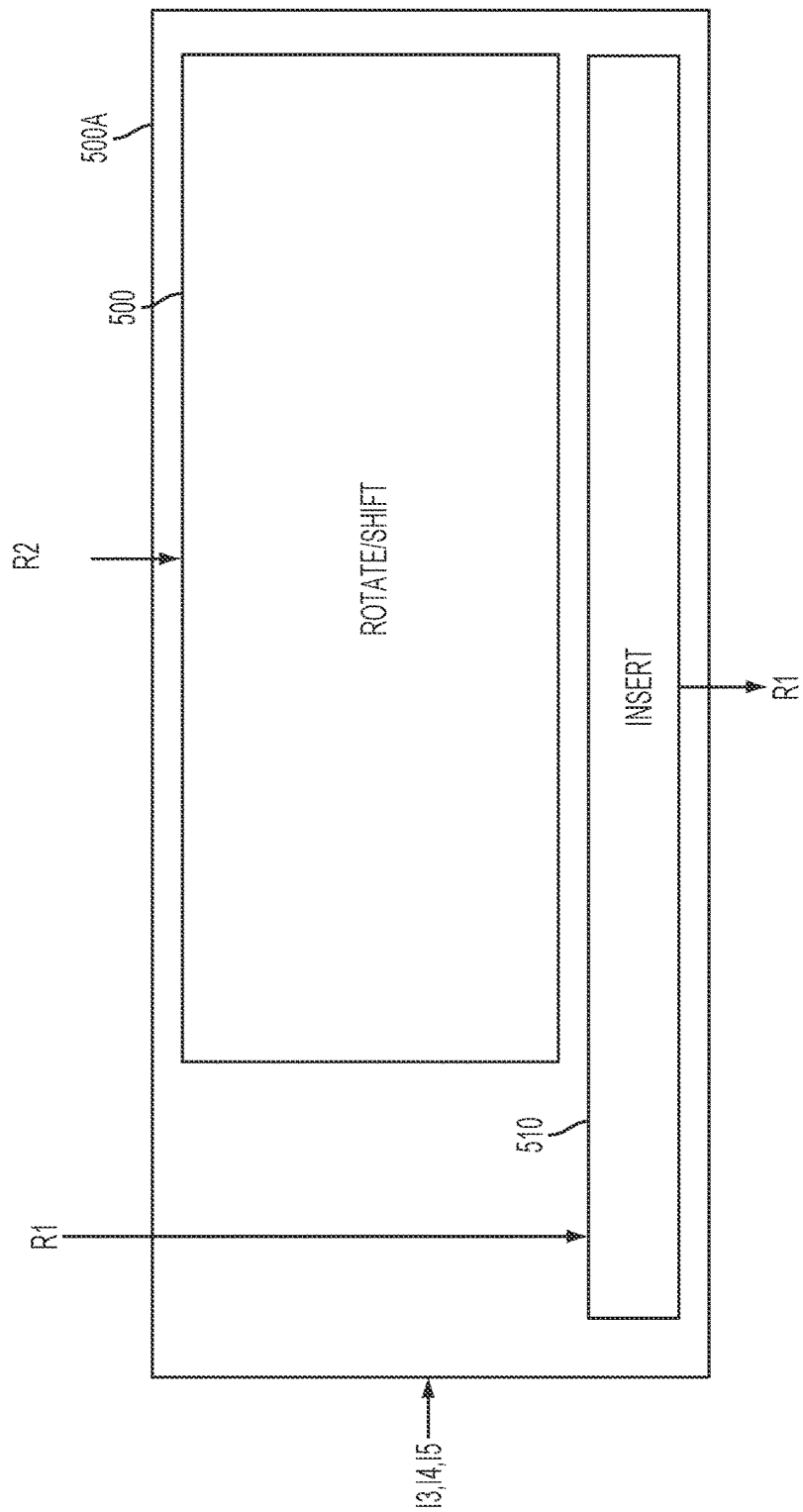
FIGS. 5A and 5B depict additional block diagrams of additional circuit configurations for performing in a single operation two adjustments in accordance with one or more embodiments.

In accordance with one embodiment, RISBGN, rlwimi and similar instructions are implemented using rotate and insert logic 500A shown in FIG. 5A having input ports for register input operands R1 and R2 (for example, in accordance with RISBGN), or RA and RS (for example, in accordance with rlwimi), respectively. Operand R2 (respectively RS) is rotated by shifter logic 505, e.g., implemented in accordance with the barrel shifter of FIGS. 2 and 3. In yet another aspect, for R2 the insert logic 510 may be bypassed and at least one mode of the operation logic 500A implements one of a rotate and insert instructions (inside rotate and shift logic 505). The rotated value is inserted into operand R1 (RA, respectively) by insert logic 510 and provided as result R1 (in accordance with RISBGN), or RA (in accordance with rlwimi).

Figure 5B:
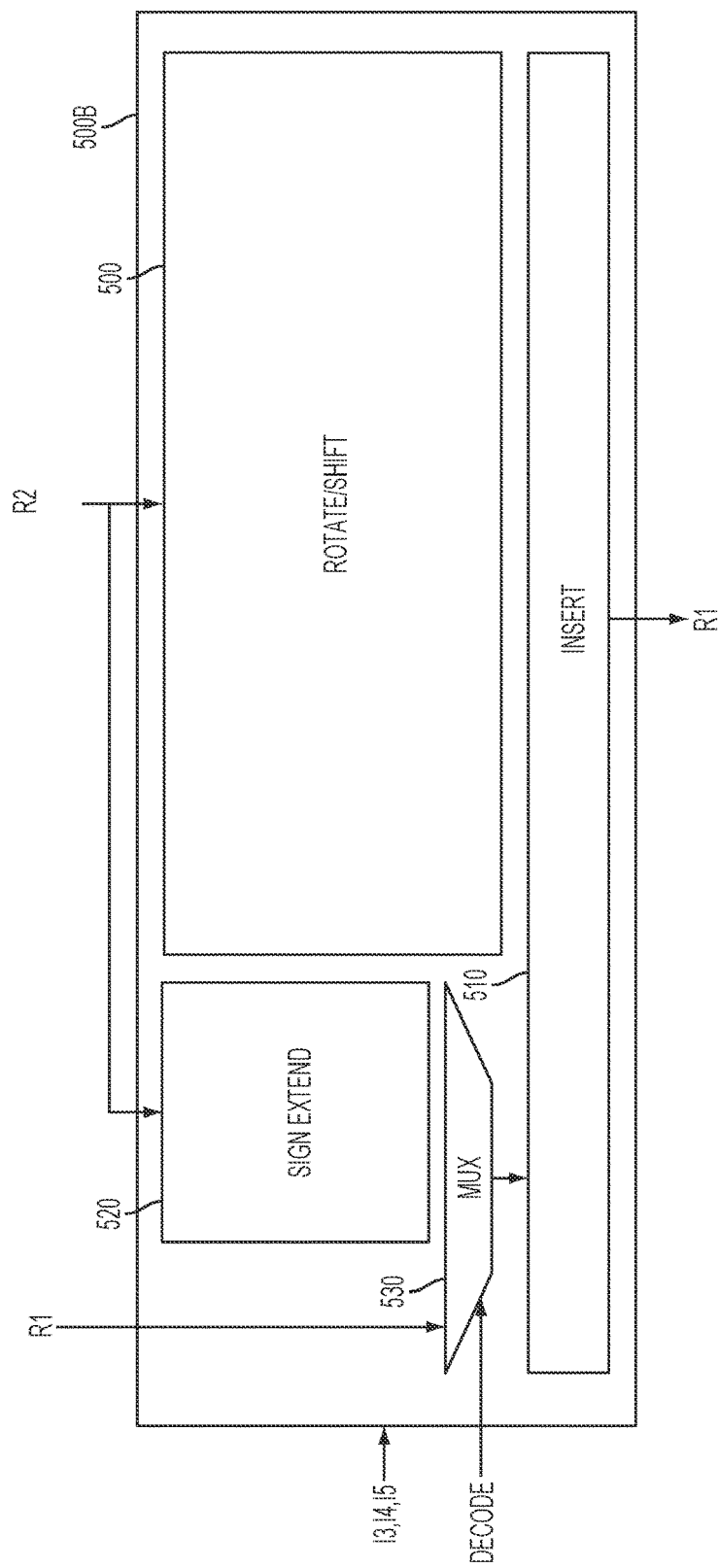

In accordance with one embodiment shown in FIG. 5B, the rotate and insert function of FIG. 5A is extended with sign extension logic 520 sign extending register R2, and a MUX 530 selecting between input R1 and sign extended register R2 being generated by sign extension logic 520. A selector MUX (not shown) is operably coupled to a selection signal generated by decode logic and provided as a selection input of MUX 530, thereby indicating the presence of a first one or more rotate-and-insert instructions, e.g., in accordance with RISBGN, rlwimi or other such instructions, and a second double adjustment instruction such as SLLGF or indexw instruction. Sign extension logic 520 operates in parallel with rotate and shift logic 505 and is integrated into rotate and insert logic 500B. In accordance with one such embodiment, rotate and insert logic 500B performs at least a selectable first rotate and insert, and a second single operation double adjustment. In accordance with another such embodiment, rotate and insert logic 500B performs at least a selectable first rotate and insert, a second shift and/or rotate, and a third single operation double adjustment.

Thus it can be seen from the foregoing detailed description that the present disclosure provides a number of technical benefits. For example, under conventional operation, the selection logic and data path of a contemporary barrel shifter work together to perform one operation, which is to shift a specified value. However, under the present disclosure, the selection logic, which as noted above is the low-overhead portion of the barrel shifter, is configured to also perform a sign extension. Hence the barrel shifter of the present disclosure performs two adjustments (i.e., a sign extension and a shift) in the same operation/circuit. The present disclosure recognizes that sign extension is a type of pseudo shift operation that may be performed, with appropriate instruction from control/selection logic, along with a regular shift by a MUX data path of a barrel shifter. For the sign extension adjustment, the sign bit in the source register is picked. For the shift adjustment, the data bit(s) of the source register are picked. Thus, the selection logic can control the data path to perform all of the shifts and pseudo shifts (i.e., pseudo shifts that perform the sign extension, along with shifts that perform the data shift) associated with both adjustments in a single barrel shift operation. Overall operation of the computer is improved because the selection logic is a significantly smaller portion of the overall barrel shifter's overhead, contributing very little to the time and cost to the barrel shifter's operation.

In one or more embodiments the present disclosure provides systems and methodologies that perform a multiple step array index computation in a single operation. The single operation makes an adjustment corresponding to the size of a first data type specifying the position of a second data type within an array/aggregate to a third data type preferably corresponding to the size of an address. The single operation further makes an adjustment corresponding to the size of the second data type. In one or more embodiments, data adjustment is performed in a data path adapted to, for each data bit, perform the selection of a data bit from among a plurality of positions, the selection being performed to select based on of either: no adjustment, an adjustment corresponding to the size of the first data type specifying the position of a second data type within an array/aggregate, an adjustment corresponding to the size of the second data type, and an initialization.

Thus, the present disclosure provides systems and methodologies for providing a single processor operation that performs at substantially the same time both adjustments needed in order to complete an array index computation. The disclosed single processor operation accesses a 32-bit integer that is an index, sign extends the index to 64-bits, then adjusts the sign extended index in accordance with the size of the base element. The teachings of the present disclosure would apply to any differential between a parameter of the index and a parameter of the array memory. Implementing an array index computation using the disclosed single processor operation decreases programming overhead, which has a positive overall impact on the computer system's performance, particularly for large data sets. Thus, the functioning of a computer itself may be improved.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

The present disclosure may be a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure Aspects of the present disclosure are described herein with reference to flowchart illustrations and/or block diagrams of methods, apparatus (systems), and computer program products according to embodiments of the present disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method of adjusting an index, wherein the index identifies a location of an element within an array, the method comprising:
performing, by a shift circuit, a single operation that:
performs, using a selection logic circuit of the shift circuit, an adjustment of a first parameter of the index to match a parameter of an array address; and
performs an adjustment of a second parameter of the index to match a parameter of the array element.

2. The method of claim 1, wherein:
said array address comprises a start location of the array;
said first parameter comprises a size of the index;
said second parameter comprises a value of the index;
said parameter of the array address comprises a size of the array address; and
said parameter of the array element corresponds to a size of the array element.

3. The method of claim 1, wherein said adjustment of said first parameter comprises a sign extension of said first parameter.

4. The method of claim 3, wherein:
said adjustment of said first parameter of the index comprises a pseudo shift; and
said adjustment of said second parameter of the index comprises a shift.

5. The method of claim 4, wherein:
said shift circuit comprises a data path;
said data path comprises multiple levels; and
said multiple levels perform said pseudo shift and said shift.

6. The method of claim 5, wherein:
said pseudo shift comprises replicating said sign of said value of said index; and
said shift comprises shifting bits of the index.

7. The method of claim 4, wherein:
said shift circuit comprises a selection logic; and
said selection logic instructs said data path to perform said pseudo shift and said shift.

8. The method of claim 7, wherein:
said pseudo shift comprises replicating said sign of said value of said index by an amount corresponding to a size of the array address; and
said shift comprises shifting said second parameter by an amount corresponding to said parameter of the array element.

9. The method of claim 1, wherein said adjustment of said second parameter comprises shifting said second parameter by an amount corresponding to said parameter of the element.

10. The method of claim 1, wherein said adjustment of said first parameter of said index or said adjustment of said second parameter of said index comprises performing at least one of a shift and a rotate operation when an input size of said at least one of a shift and a rotate corresponds to an output size of said at least one of a shift and a rotate.

11. The method of claim 10, wherein said shift circuit is further configured to select an unmodified input value as another value into which to insert said at least one of a shifted and a rotated value.

12. The method of claim 1, wherein:
said shift circuit comprises a rotate-and-insert logic having a rotate function and an insert function; and
said insert function is configured to comprise inserting a rotated index value into another value;
wherein said another value corresponds an output of a sign extended index value.

13. The method of claim 1, wherein:
said shift circuit comprises a shift-and-insert logic having a shift function and an insert function; and
said insert function is configured to comprise inserting a shifted index value into another value;
wherein said another value corresponds an output of a sign extended index value.

* * * * *